United States Patent
Tseng (10) Patent No.: US 6,995,086 B2
(45) Date of Patent: Feb. 7, 2006

(54) METHOD FOR FABRICATING A THROUGH HOLE ON A SEMICONDUCTOR SUBSTRATE

(75) Inventor: Shien Chun Tseng, Hsin-Chu Hsien (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 38 days.

(21) Appl. No.: 10/710,237

(22) Filed: Jun. 28, 2004

(65) Prior Publication Data
US 2005/0148168 A1    Jul. 7, 2005

(51) Int. Cl.
*H01L 21/4763* (2006.01)
(52) U.S. Cl. ........................... 438/637; 438/734
(58) Field of Classification Search ............. 438/636, 438/637, 672, 675, 700, 734
See application file for complete search history.

(56) References Cited

U.S. PATENT DOCUMENTS

| | | | | | |
|---|---|---|---|---|---|
| 5,702,568 | A | * | 12/1997 | Shin et al. | 438/632 |
| 5,883,007 | A | * | 3/1999 | Abraham et al. | 438/714 |
| 6,046,101 | A | * | 4/2000 | Dass et al. | 438/624 |
| 6,153,504 | A | * | 11/2000 | Shields et al. | 438/613 |
| 6,156,663 | A | * | 12/2000 | Watanabe et al. | 438/695 |
| 6,534,396 | B1 | * | 3/2003 | Fahn et al. | 438/632 |

* cited by examiner

*Primary Examiner*—Amir Zarabian
*Assistant Examiner*—Khanh Duong
(74) *Attorney, Agent, or Firm*—Winston Hsu (57) ABSTRACT

A method for fabricating a through hole is disclosed. First, a conductive structure having a conductive layer and a cap layer are formed on a substrate. A patterned first photoresist layer is formed on the substrate and the conductive structure to define a pattern of the through hole. Then, a first etching process to remove the cap layer not covered by the first photoresist layer is performed until the conductive layer is exposed. The first photoresist layer is removed. A dielectric layer and a patterned second photoresist layer are formed on the substrate. Finally, a second etching process is performed to remove the dielectric layer not covered by the second photoresist layer until the conductive layer is exposed. The pattern of the second photoresist layer is the same as the pattern of the first photoresist layer.

11 Claims, 10 Drawing Sheets

METHOD FOR FABRICATING A THROUGH HOLE ON A SEMICONDUCTOR SUBSTRATE

BACKGROUND OF INVENTION

1. Field of the Invention

The invention relates to a method for fabricating a through hole, and more particularly, to a method for fabricating a through hole by performing two etching processes.

2. Description of the Prior Art

In semiconductor fabrication, in order to electrically connect device as metal oxide semiconductor (MOS) transistors with each metal conductive layer to form a complete electrical circuit, contact plugs and via plugs need to be formed in dielectric layers for serving as conductive lines of the MOS transistors and metal conductive layers when performing a multilevel metallization process.

The conventional process for forming contact plugs and via plugs includes performing an etching process to form through holes, such as contact holes and via holes, in the dielectric layers, and filling with metal materials with low resistivity into the contact holes and via holes to form the contact plugs and the via plugs. Since through hole manufacture affects the reliability of the electrical connection between two metal layers or conductive layers, it often becomes an important factor of the fabrication performance of the very large scale integration circuit.

Figure 1:
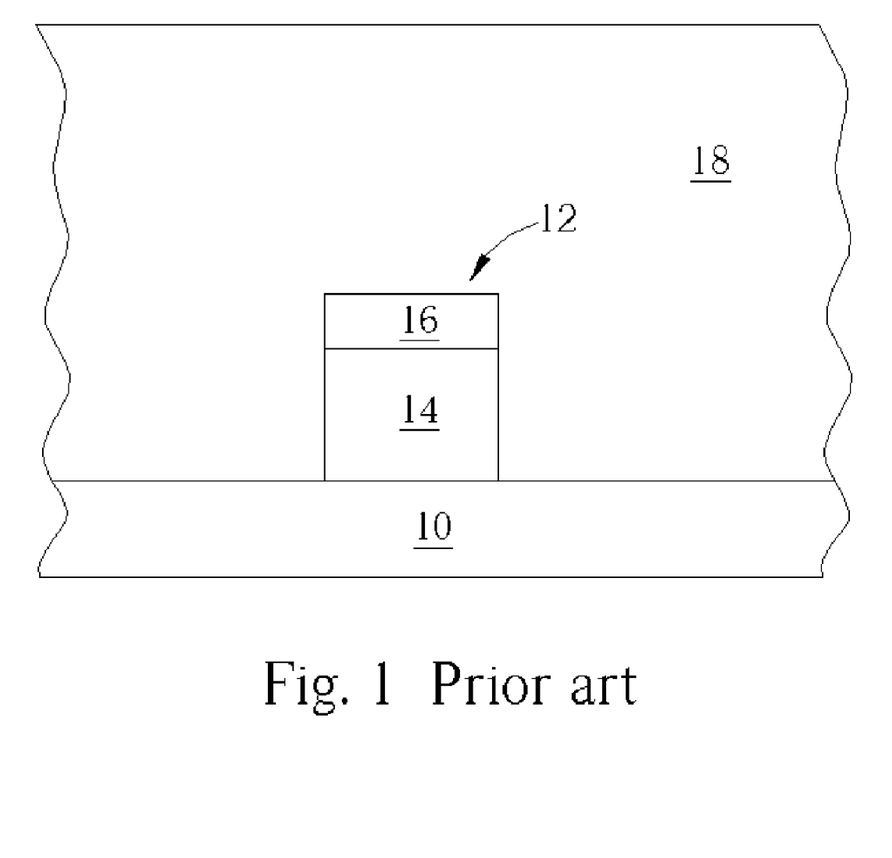
FIGS. 1–3 are schematic diagrams of a method for fabricating a through hole on a substrate according to the prior art.
Figure 2:
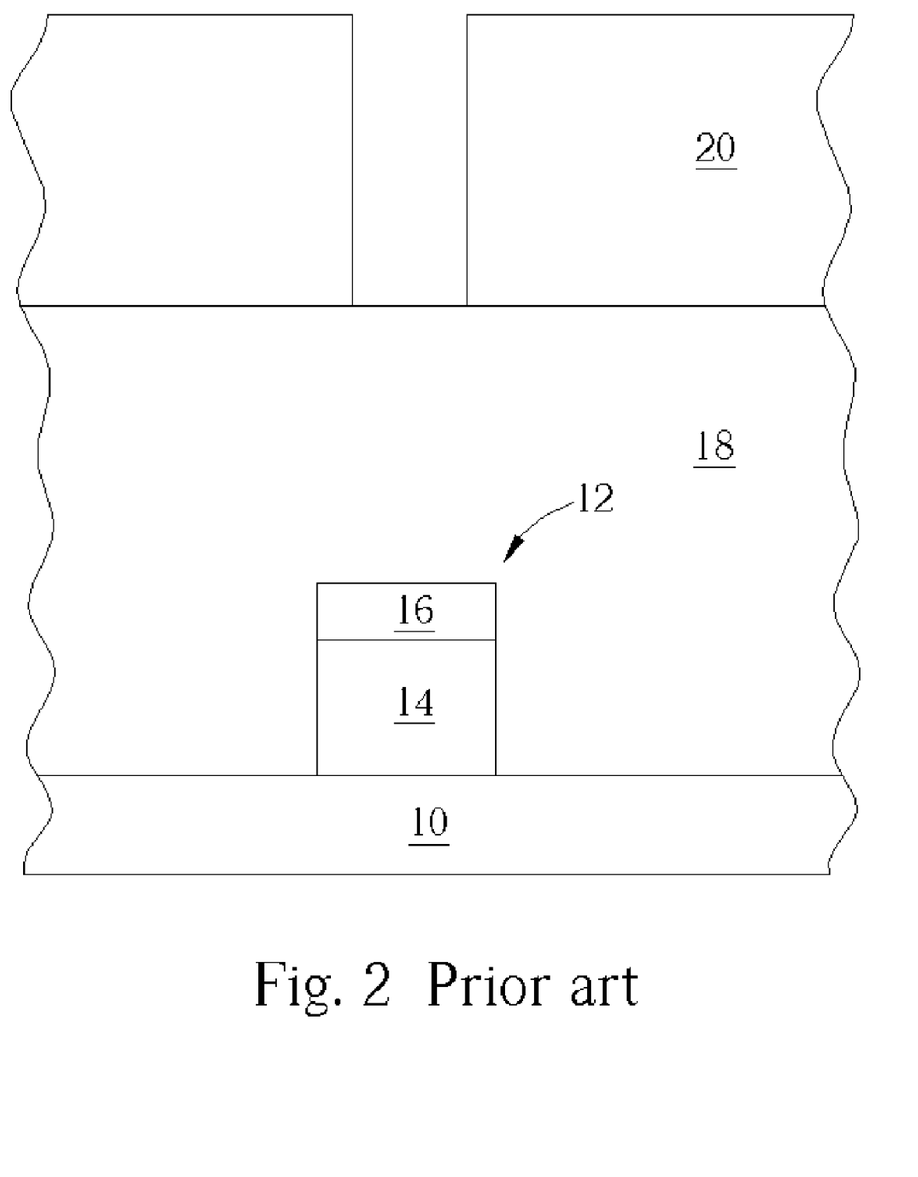
Figure 3:
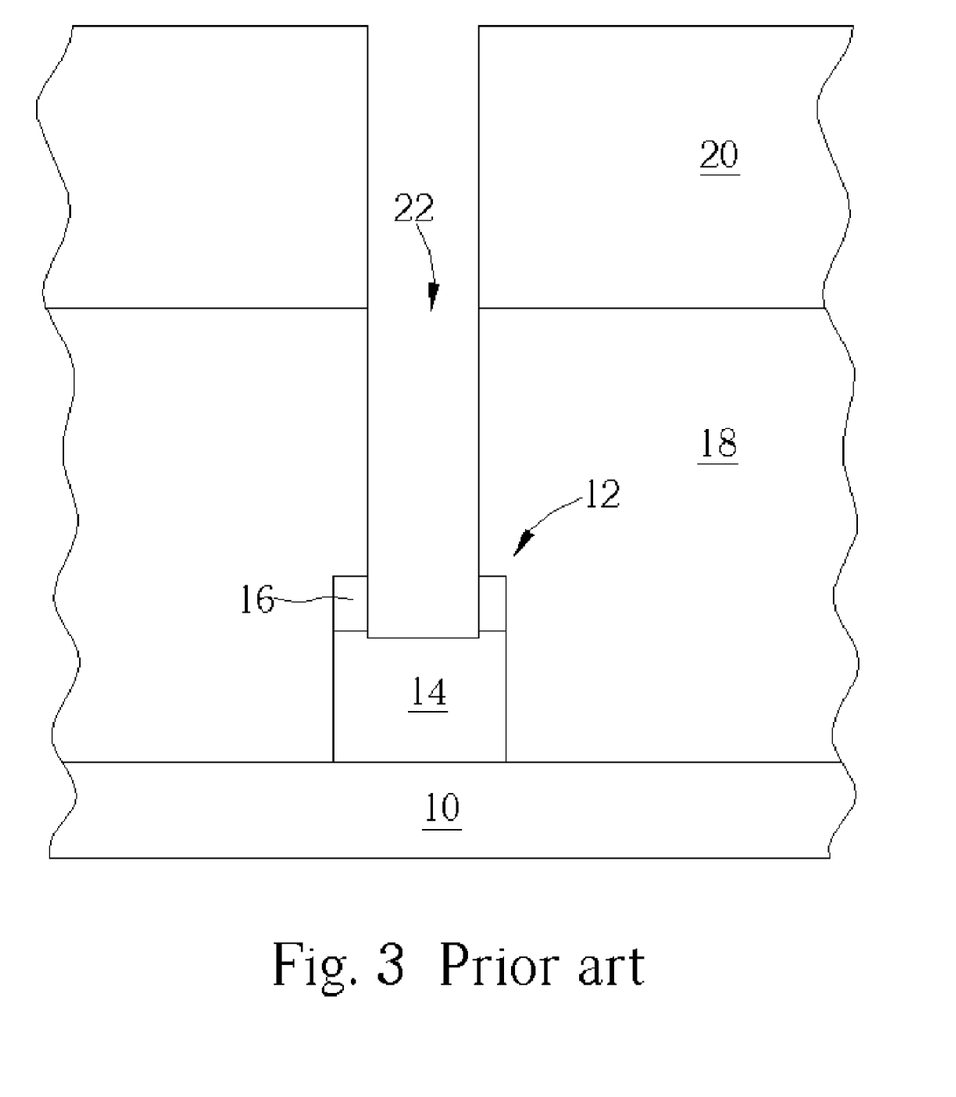

Please refer to FIGS. 1–3. FIGS. 1–3 are schematic diagrams of a method for fabricating a through hole on a substrate 10 according to the prior art. As shown in FIG. 1, the substrate 10 comprises a conductive structure 12, wherein the conductive structure serves as a gate, a word line, a bit line, or a metal conductive line and comprises a metal conductive layer 14 and an anti-reflection coating (ARC) layer. According to the prior art, a dielectric layer 18 is formed on the surface of the substrate 10 at first. Then, as shown in FIG. 2, a patterned photoresist layer 20 is formed on the surface of the dielectric layer 18 to define at least a through hole above the conductive structure 12. Then, as shown in FIG. 3, an etching process is performed by taking the photoresist layer 20 as an etching mask to remove the dielectric layer 18 and the ARC layer 16 not covered by the photoresist layer 20 until the surface of the conductive layer 14 is exposed. Finally, the photoresist layer 20 is removed to accomplish the fabrication of the through hole 22.

Referring to FIG. 3, during the etching process using the photoresist layer 20 as the etching mask, the ARC layer 16 is etched in situ after the dielectric layer 18, which means the ARC layer 16 and the dielectric layer 18 are etched in the same reaction chamber. Generally, when the conductive layer 14 is composed of metal materials, such as alloy of Al and Cu, the ARC layer 16 will be composed of TiN, Ti, or the combination thereof, and the dielectric layer 18 will be composed of oxide. Therefore, $CF_4$, $CHF_3$, or other etching gases with high selectivity to oxide materials are chosen as the etching agent since the dielectric layer 18 is the primary etching object. However, the above-mentioned etching gases have low etching rates in the ARC layer 16 composed of TiN/Ti. Accordingly, the photoresist layer 20 serving as an etching mask is required to have a quite thick thickness to sustain a quite long time of the etching process until the ARC layer 16 is completely opened. During a longer etching process, corners being cut or collapse problem may possibly occur on the thicker photoresist layer 20. In addition, when the ARC layer 16 is being etched, the dielectric layer 18 positioned on the ARC layer 16 may be affected by the etching gas so that the through hole 22 will have an irregular sidewall. Furthermore, residues resulting from the removed ARC layer 16 may be formed on the sidewall of the dielectric layer 18 when etching the ARC layer 16, and such residues are hard to remove from the dielectric layer 18 so that the quality of the through hole 22 is degraded.

SUMMARY OF INVENTION

It is therefore a primary objective of the claimed invention to provide a method for fabricating a through hole that can remove the ARC layer with high efficiency to solve the above-mentioned problem.

According to the claimed invention, a method for fabricating at least a through hole on a substrate is provided. The method includes forming a conductive structure having a conductive layer and a cap layer on the substrate, forming a patterned first photoresist layer on the substrate and the conductive structure to define at least a pattern of the through hole, performing a first etching process to remove the cap layer not covered by the first photoresist layer until the conductive layer is exposed, removing the first photoresist layer, forming a dielectric layer and a patterned second photoresist layer on the substrate in sequence, wherein the pattern of the second photoresist layer is the same as the pattern of the first photoresist layer, and performing a second etching process to remove the dielectric layer not covered by the second photoresist layer until the conductive layer is exposed.

It is an advantage of the claimed invention that the ARC layer is anteriorly etched before the dielectric layer is formed so that an etching agent having high etching selectivity to the ARC layer can be used to effectively remove the ARC layer. Accordingly, a thinner photoresist layer can be used as the etching mask in the second etching process for etching the dielectric layer because the longer etching process for etching the ARC layer in the prior art is not needed anymore. In this situation, the problem of corners being cut or collapsing of the photoresist layer can be avoided. Furthermore, because the thickness of the photoresist layer of the claimed invention is thinner than that of the photoresist layer in prior art method, the design of circuit layout and line width can be advanced to increase the integration of the semiconductor devices.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 4:
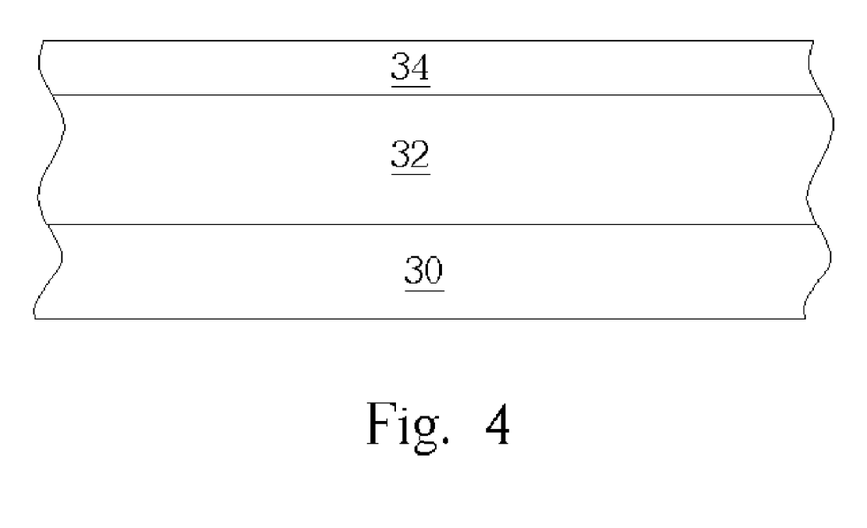
FIGS. 4–10 are schematic diagrams of a method for fabricating at least a through hole on a substrate according to the present invention.

Please refer to FIGS. 4–10. FIGS. 4–10 are schematic diagrams of a method for fabricating at least a through hole on a substrate 30 according to the present invention. As shown in FIG. 4, a metal conductive layer 32 and an ARC layer 34 are formed on the surface of the substrate 30, wherein the substrate 30 may further have a plurality of prefabricated semiconductor elements and dielectric layers.

The metal conductive layer 32 is composed of usual conductive materials of semiconductor process, such as aluminum alloy or aluminum copper alloy. The ARC layer 34 is used to reduce the high reflectivity of the metal conductive layer 32 to insure the accuracy and performance of the photolithography and etching process, and thereby the ARC layer 34 is composed of materials which can meet this requirement, such as TiN/Ti.

Figure 5:
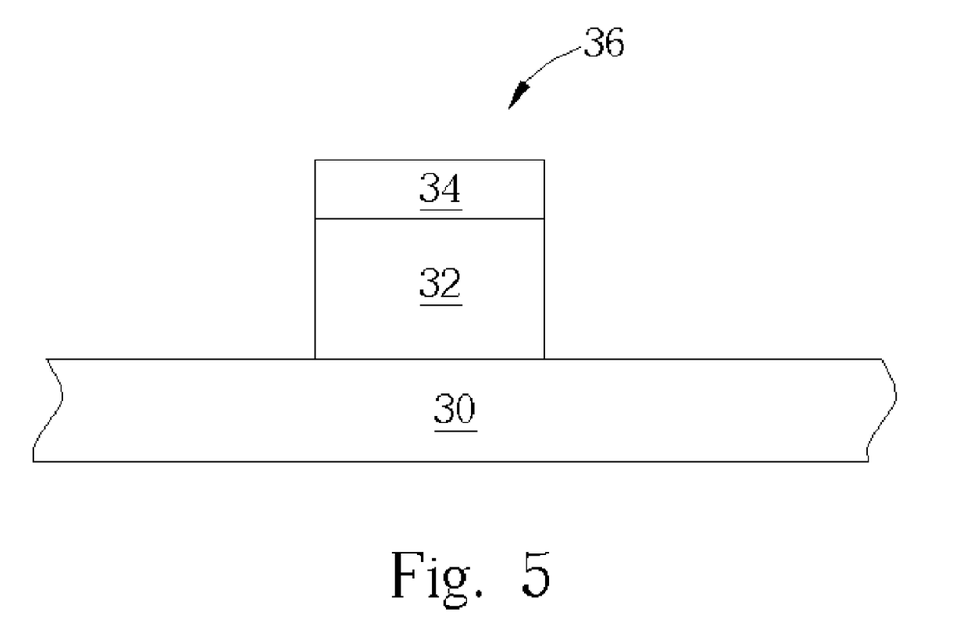
Figure 6:
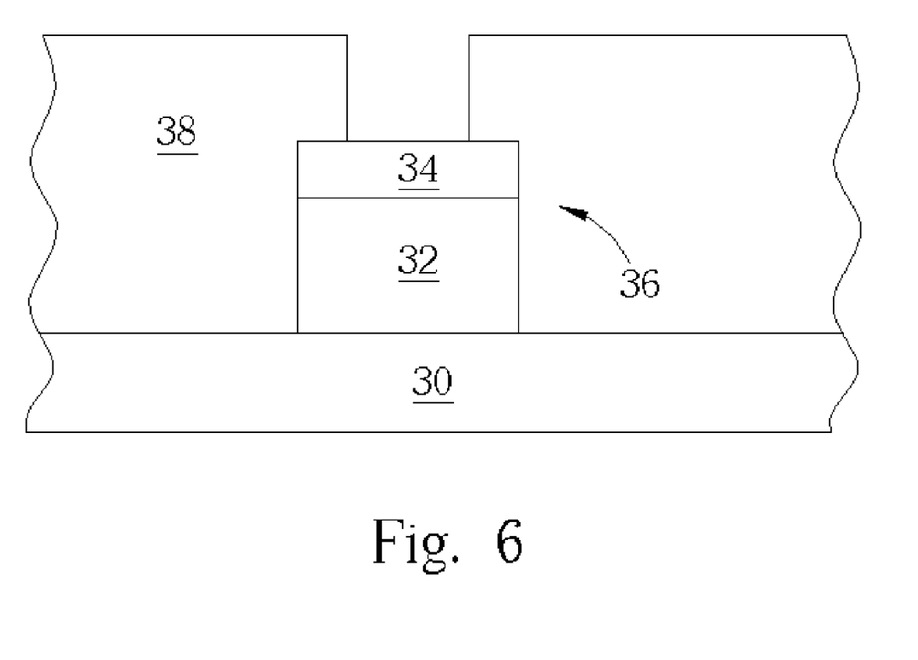
Figure 7:
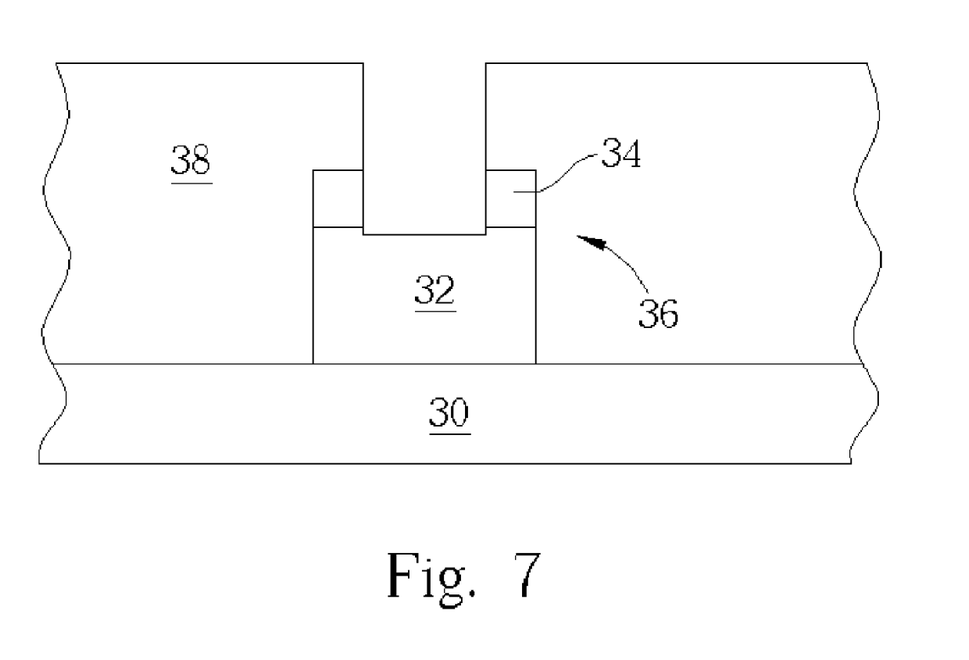

As shown in FIG. 5, a photolithography and etching process is performed to form a patterned photoresist layer (not shown) on the ARC layer 34 to define a conductive line. Then, the patterned photoresist layer is taken as an etching mask to perform an etching process for removing a portion of the ARC layer 34 and a portion of the metal conductive layer 32 so that a conductive structure, the conductive line 36, is formed. After that, the fabrication of through holes is performed above the conductive line 36. Referring to FIG. 6, a first photoresist layer 38 is formed on the substrate 30, and a photolithography process is performed to define at least a through hole pattern on the photoresist layer 38 located above the conductive line 36. Then, as shown in FIG. 7, a first etching process is performed by taking the first photoresist layer 38 as an etching mask to remove the ARC layer 34 not covered by the first photoresist layer 38 until a first portion of the metal conductive layer 32 is exposed. After the first etching process, the first photoresist layer 38 is removed.

Since the main object of the first etching process is the ARC layer 34, the etching agent is selected according to if the etching agent has a better etching selectivity to the ARC layer 34 or not. For example, if the ARC layer 34 is composed of TiN/Ti, the etching agent is selected from the group consisting of $BCl_3/Cl_2$, $CCl_4$, and $SF_6$ so that the exposed TiN/Ti ARC layer 34 can be removed more rapidly. In addition, as both of the former etching process for forming the conductive line 36 and this first etching process are meant for removing a portion of the ARC layer 34, these two etching processes can utilize the same etching agent and can be performed in the same reaction chamber. In addition, because only the ARC layer 34 is the etching object of the first etching process, the thickness of the first photoresist layer 38 used as the etching mask can be thinner provided that it can sustain the first etching process until the ARC layer 34 is opened.

Figure 8:
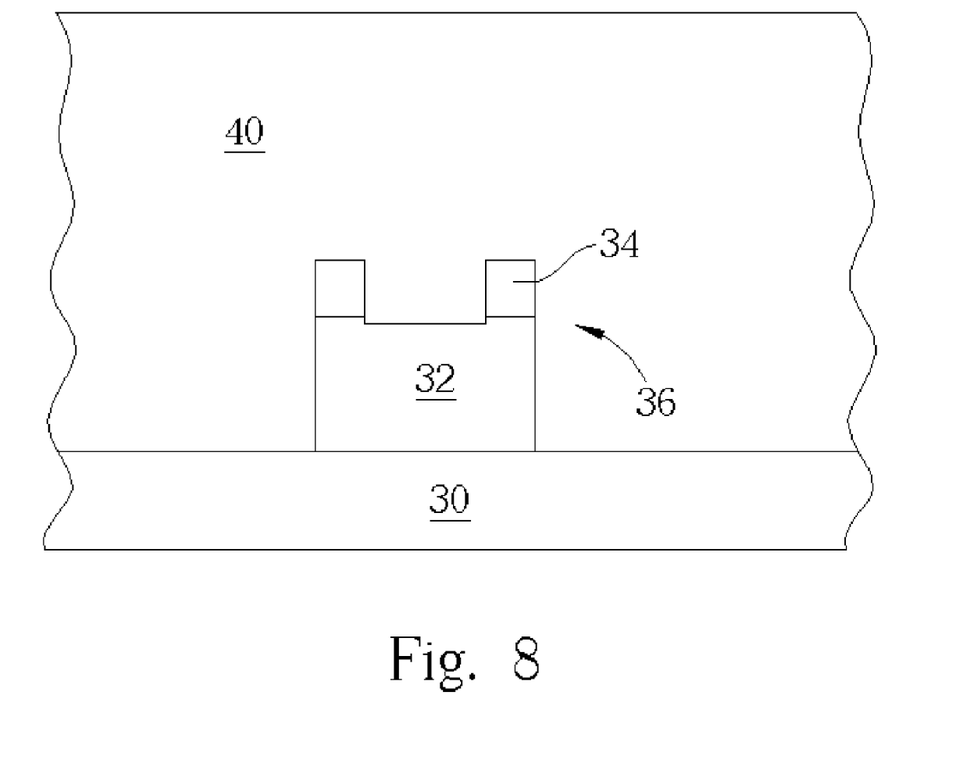
Figure 9:
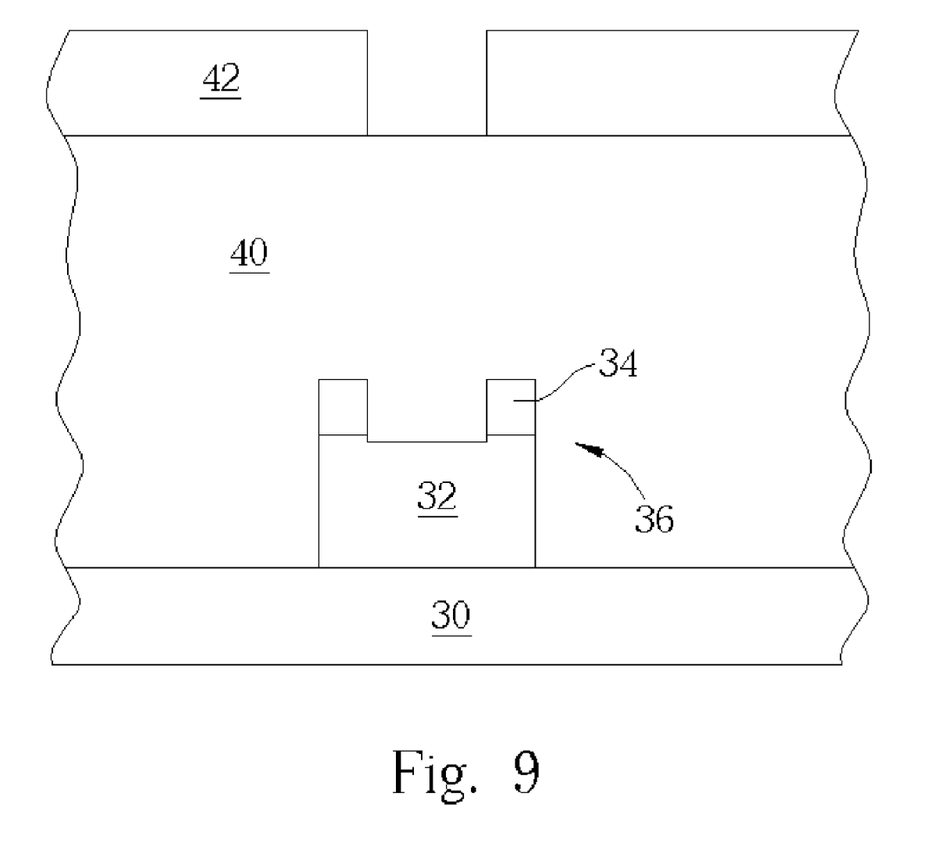
Figure 10:
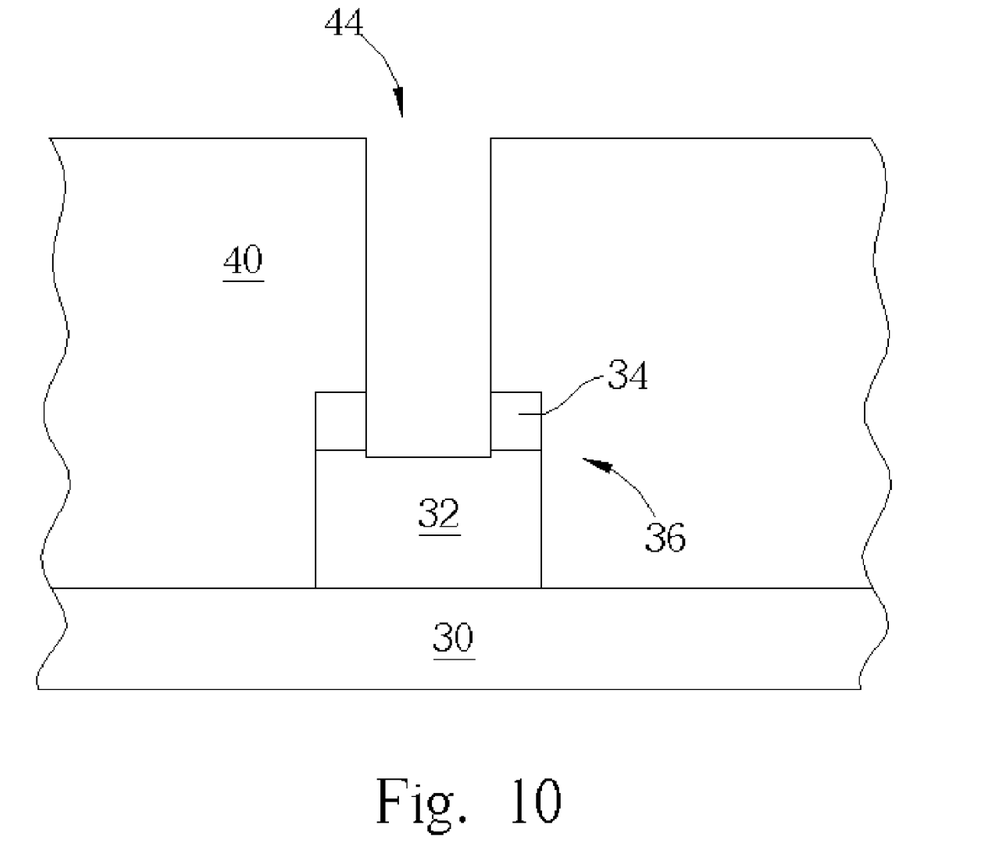

Please refer to FIG. 8. A dielectric layer 40 is then formed on the substrate 30, and meanwhile, the opening of the ARC layer 34 is filled with the dielectric material. A chemical mechanical polishing process or a thermal flow process is optionally performed to planarize the surface of the dielectric layer 40. Referring to FIG. 9, a patterned second photoresist layer 42 is formed on the dielectric layer 40, wherein the pattern of the second photoresist layer 42 is the same as the pattern of the first photoresist layer 38 to define the through hole on the conductive line 36. Then, a second etching process is performed by taking the second photoresist layer 42 as an etching mask to remove the dielectric layer 40 not covered by the second photoresist layer 42 until the first portion of the metal conductive layer 32 is exposed. If the dielectric layer 40 is composed of oxide, an etching gas having high etching rate to the oxide layer, such as $CHF_3$, $CF_4$, or Ar, can be selected as the etching agent of the second etching process. Finally, the residual second photoresist layer 42 is removed to accomplish the fabrication of the through hole 44, as shown in FIG. 10.

The following process of filling conductive materials into the through hole 44 for fabricating a contact plug includes forming a glue layer, such as a Ti/TiN layer, on the surface of the sidewall of the through hole 44, and filling the through hole 44 with conductive materials, such as tungsten, so that the conductive line 36 can be electrically connected to the posteriorly formed conductive elements positioned on the dielectric layer 40. The fabrication process of contact plugs is a well-know process to those skilled in the art, thus no extraneous description will be provided herein. In addition, in another embodiment of the present invention, a metal material, e.g. aluminum, can be used to directly fill the through hole 44. Then an etching process is performed to the metal material positioned on the dielectric layer 40 to form metal conductive lines above the dielectric layer 40 and to electrically connect the upper metal conductive line and the conductive line 36 simultaneously.

The present invention method can be applied to any fabrication process for electrically connecting the conductive layers positioned below and above the dielectric layers or any fabrication process of through holes, such as contact holes, via holes, and through holes above gate structures or dual damascene structures. This means the present invention method can be utilized in any applications for fabricating a through hole on a conductive layer having a cap layer thereon, wherein the cap layer has a different etching selectivity from that of the dielectric layer positioned on the cap layer so as to fabricate the through holes with better profiles and save the process time. For example, when the conductive layer and the cap layer are a doped polysilicon layer and a nitride layer respectively, it is appropriate to apply the present invention method. It should be noticed that the barrier layers, ARC layers, mask layer, or passivation layers of semiconductor process are all included in the definition of the cap layer according to the present invention. On the other hand, a machine with lower fabrication functionality can be utilized to perform a process used to be performed with machines with higher fabrication functionality according to the spirit of the present invention. Consequently, existing equipment and machines can still be used when the design standards of products are changed to more accuracy, without affecting the machines. For example, when the thickness of element material becomes thicker according to the design requirement, according to the present invention, a machine with lower etching functionality can still be used to etch the specific material in several stages by using the machine with higher etching functionality, so that the cost of equipment can be saved.

In contrast to the prior art, the present invention method performs the etching process for forming a through hole in two stages: a first etching process to etch the cap layer for forming a through hole pattern in the cap layer, and a second etching process to etch the dielectric layer formed on the cap layer for forming the through hole pass through the dielectric layer and the cap layer. Since each of the first and second etching processes can use an etching agent with high etching selectivity for its own etching object, the cap layer and the dielectric layer respectively, completely opening the cap layer is guaranteed according to the present invention. Even when the cap layer is thicker than a conventional thickness of the cap layer, the thicker cap layer can still be opened with the first etching process effectively. According to the present invention, the sidewall of the through hole can have a better profile, and the etching rate can be increased so that the time of etching the cap layer can be reduced. Therefore the efficiency of fabrication process can be raised. Furthermore, the second photoresist layer taken as the etching mask is thinner than that of the prior art, thus the problem of collapse of the photoresist layer can be avoided. Accordingly, for the photolithography process, an advanced design with smaller line width and higher density can be applied.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a through hole comprising:
    forming a conductive structure on a substrate, wherein the conductive structure comprises at least a conductive layer and a cap layer positioned on the conductive layer;
    forming a patterned first photoresist layer on the substrate and the conductive structure to define at least a pattern of a through hole;
    performing a first etching process to remove the cap layer not covered by the first photoresist layer until at least a first portion of the conductive layer is exposed;
    removing the first photoresist layer;
    forming a dielectric layer and a patterned second photoresist layer on the substrate in sequence, wherein a pattern of the second photoresist layer is the same as a pattern of the first photoresist layer; and
    performing a second etching process to remove the dielectric layer not covered by the second photoresist layer until the first portion of the conductive layer is exposed.

2. The method of claim 1, wherein the conductive layer is a metal layer, and the cap layer is an anti-reflection coating (ARC) layer.

3. The method of claim 1, wherein the step of forming the conductive structure on the surface of the substrate comprises:
    forming the conductive layer on the substrate;
    forming the cap layer on the conductive layer;
    forming a patterned third photoresist layer on the cap layer to define the conductive structure;
    performing a third etching process by taking the third photoresist layer as an etching mask to remove the cap layer and the conductive layer not covered by the third photoresist layer; and
    removing the third photoresist layer.

4. The method of claim 3, wherein the first etching process and the third etching process are performed in the same reaction chamber.

5. The method of claim 3, wherein the first etching process and the third etching process utilize the same etching agent.

6. The method of claim 2, wherein the metal layer comprises an aluminum alloy layer.

7. The method of claim 2, wherein the ARC layer comprises a titanium nitride or/and titanium (TiN/Ti) layer.

8. The method of claim 7, wherein the etching agent of the first etching process is selected from the group consisting of $BCl_3/Cl_2$, $CCl_4$, and $SF_6$.

9. The method of claim 1, wherein the conductive layer comprises a doped polysilicon layer, and the cap layer comprises a silicon nitride layer.

10. The method of claim 1, wherein the dielectric layer comprises an oxide layer.

11. The method of claim 10, wherein an etching agent of the second etching process is selected from the group consisting of $CHF_3$, $CF_4$, and Ar.

* * * * *